(12) United States Patent  
Shao et al.

(10) Patent No.: US 9,240,374 B2  
(45) Date of Patent: Jan. 19, 2016

(54) SEMICONDUCTOR DEVICE AND METHOD OF FORMING THEREOF

(71) Applicant: GLOBALFOUNDRIES Singapore Pte. Ltd., Singapore (SG)

(72) Inventors: Wei Shao, Singapore (SG); Wanbing Yi, Singapore (SG); Shunqiang Gong, Singapore (SG); Chao Zhu, Singapore (SG); Juan Boon Tan, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 0 days.

(21) Appl. No.: 14/142,934

(22) Filed: Dec. 30, 2013

(65) Prior Publication Data

US 2015/0187700 A1 Jul. 2, 2015

(51) Int. Cl.

| | |
|---|---|
| *H01L 23/48* | (2006.01) |
| *H01L 23/52* | (2006.01) |
| *H01L 29/40* | (2006.01) |
| *H01L 23/522* | (2006.01) |
| *H01L 21/768* | (2006.01) |
| *H01L 23/532* | (2006.01) |

(52) U.S. Cl.
CPC ...... *H01L 23/5226* (2013.01); *H01L 21/76846* (2013.01); *H01L 23/53295* (2013.01); *H01L 23/53214* (2013.01); *H01L 23/53228* (2013.01); *H01L 23/53257* (2013.01); *H01L 2924/0002* (2013.01)

(58) Field of Classification Search
CPC ......... H01L 23/48; H01L 23/52; H01L 29/40; H01L 23/53238; H01L 2924/01079; H01L 2924/01013
USPC ............. 257/762, 773, 758; 438/627, 643
See application file for complete search history.

(56) References Cited

U.S. PATENT DOCUMENTS

| 8,022,552 | B2* | 9/2011 | Lin et al. ............... 257/773 |
| 8,461,684 | B2* | 6/2013 | Gordon et al. ......... 257/751 |
| 2011/0237066 | A1* | 9/2011 | Sato et al. ............. 438/627 |
| 2014/0273347 | A1* | 9/2014 | Tseng et al. .......... 438/107 |

* cited by examiner

*Primary Examiner* — Phuc Dang  
(74) *Attorney, Agent, or Firm* — Horizon IP Pte Ltd

(57) ABSTRACT

Semiconductor device and method for forming a semiconductor device are presented. The method includes providing a substrate prepared with intermediate dielectric layer having interconnect levels. The interconnect levels include $M_1$ to $M_X$ metal levels, where 1 is the lowest level and X corresponds to a number of metal level. The metal level $M_X$ includes a metal pad having an oxidized portion. An upper level having an upper dielectric layer is formed over the dielectric layer having $M_X$. The upper dielectric layer includes a plurality of via contacts over the metal pad and a metal line over the via contacts. The oxidized portion remains within the metal pad and prevents punch through between $M_X$ and its adjacent underlying metal level $M_{X-1}$.

20 Claims, 5 Drawing Sheets

US 9,240,374 B2

SEMICONDUCTOR DEVICE AND METHOD OF FORMING THEREOF

BACKGROUND

Back end of line (BEOL) process is generally used in integrated circuit (IC) fabrication process to connect active or passive devices with wirings on the wafer. In the BEOL process, multiple interconnect levels which include interconnect and via contacts, dielectric layers, contact pads and bonding sites for chip to package connections are formed. We have discovered that punch through tends to occur between interconnects in adjacent interconnect level during semiconductor processing, leading to inter-level metal electrical short. This is undesirable as it renders the IC malfunction.

From the foregoing discussion, there is a need to provide more reliable interconnects and a simplified method to form such reliable interconnects.

SUMMARY

Embodiments generally relate to semiconductor device and method of forming a semiconductor device. In one embodiment, a method for forming a device is disclosed. The method includes providing a substrate prepared with inter- mediate dielectric layer having interconnect levels. The interconnect levels include $M_1$ to $M_X$ metal levels, where 1 is the lowest level and X corresponds to a number of metal level. The metal level $M_X$ includes a metal pad having an oxidized portion. An upper level having an upper dielectric layer is formed over the dielectric layer having $M_X$. The upper dielectric layer is processed to form a plurality of via openings over the metal pad and a metal line trench over the via openings. The metal line trench is formed by providing a patterned mask layer having a pattern corresponding to the metal line trench. An etch is performed to remove portions of the dielectric layer unprotected by the patterned mask and a removal process is performed to remove the patterned mask layer. The removal process does not remove the oxidized portion of the metal pad, thereby preventing punch through between $M_X$ and its adjacent underlying metal level $M_{X-1}$.

In one example, the patterned mask for example, is formed by providing a photoresist and a bottom anti-reflective coating (BARC) layer over the upper dielectric layer and patterning the photoresist layer to form the patterned mask layer. The removal process includes, for example, performing a solvent clean to remove the photoresist, performing an ashing process to remove the BARC layer and performing a dry clean to remove remaining particles and residues of the photoresist and BARC layer. The aerosol clean, for example, comprises oxidation gases.

In another embodiment, a method for forming a device is presented. The method includes providing a substrate prepared with intermediate dielectric layer having interconnect levels. The interconnect levels include $M_1$ to $M_X$ metal levels, where 1 is the lowest level and X corresponds to a number of metal level. The metal level $M_X$ includes a metal pad having an oxidized portion. The method includes forming an upper level having an upper dielectric layer over the dielectric layer having $M_X$. The upper dielectric layer includes a plurality of via contacts over the metal pad and a metal line over the via contacts. The oxidized portion remains within the metal pad and prevents punch through between $M_X$ and its adjacent underlying metal level $M_{X-1}$.

In yet another embodiment, a device is disclosed. The device includes a substrate prepared with intermediate dielectric layer having interconnect levels. The interconnect levels include $M_1$ to $M_X$ metal levels, where 1 is the lowest level and X corresponds to a number of metal level. The metal level $M_X$ includes a metal pad having an oxidized portion. The device includes an upper level having an upper dielectric layer over the dielectric layer having $M_X$. The upper dielectric layer includes a plurality of via contacts over the metal pad and a metal line trench over the via contacts. The oxidized portion remains within the metal pad and prevents punch through between $M_X$ and its adjacent underlying metal level $M_{X-1}$.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices, such as semiconductor devices or ICs. Other types of devices may also be useful. The devices can be any type of IC, for example dynamic or static random access memories, signal processors, or system-on-chip (SoC) devices. The devices can be incorporated into, for example, consumer electronic products, such as computers, cell phones, and personal digital assistants (PDAs). Incorporating the devices in other applications may also be useful.

Figure 1:
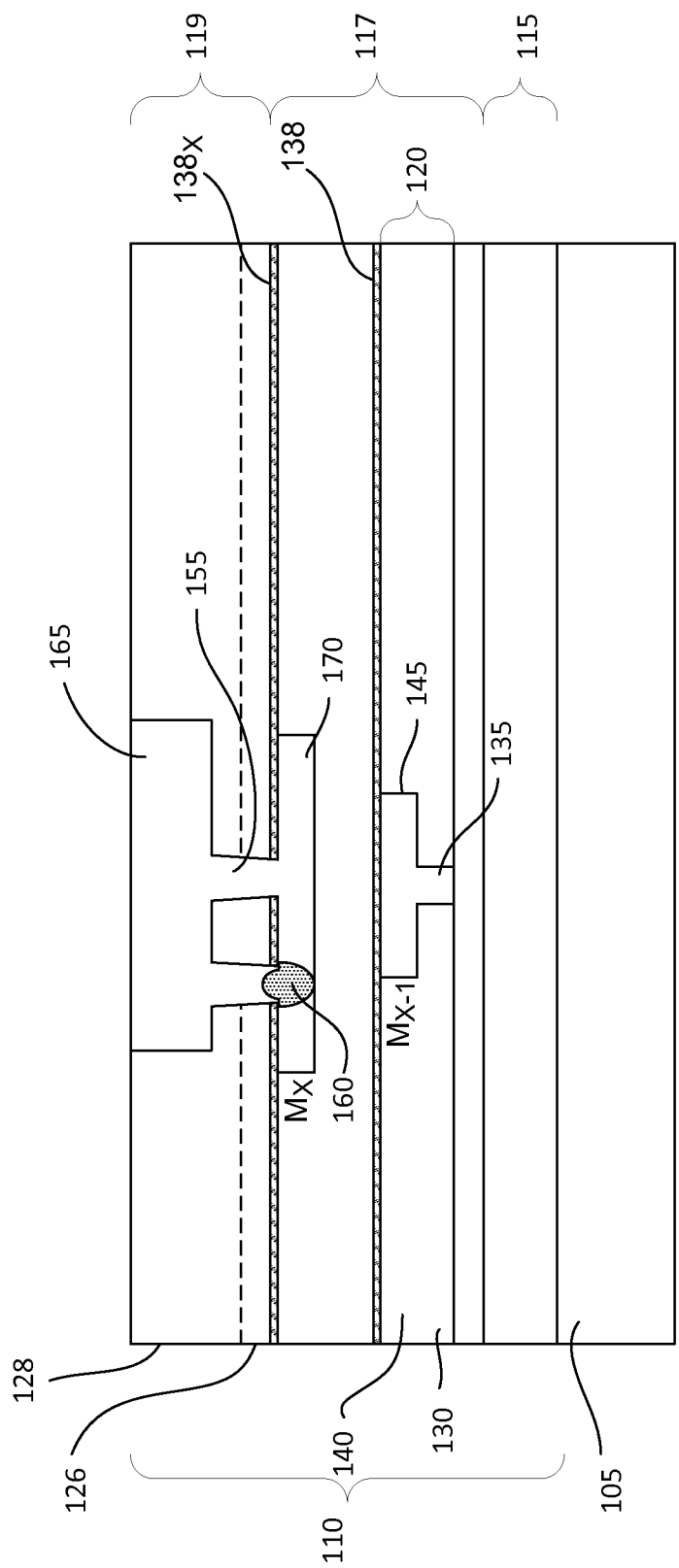
FIG. 1 shows a simplified cross-sectional view of an embodiment of a portion of a device.

FIG. 1 shows a simplified cross-sectional view of an embodiment of a portion of a device 100. The portion of the device includes a substrate 105. The substrate, for example, is a silicon substrate. Other types of substrates, such as silicon germanium or silicon-on-insulator (SOI), are also useful. The substrate may include circuit components (not shown) such as transistors formed thereon. Other types of circuit components are also useful.

Interconnects are provided to electrically couple the circuit components as desired to form the device. The interconnects are, for example, provided in a plurality of interconnect levels 110 disposed on the substrate. As shown, the interconnect levels may be grouped into lower level 115, intermediate level 117 and upper level 119. The lower and intermediate levels include $M_1$ to $M_X$, where 1 is the lowest interconnect level and x corresponds to a number of a metal level. For example, a device may have about 3-6 (e.g., x=3-6) metal levels. Providing other number of metal levels in the lower and intermediate levels may also be useful. Separating the interconnect levels, for example, is an etch stop layer 138. The etch stop layer, for example, is a nitrogen doped SiC layer. Other suitable types of etch stop layers may also be useful.

In one embodiment, the lower interconnect level includes $M_1$ while the intermediate levels include $M_2$ to $M_X$. The lower interconnect level may be referred to as the local interconnect level. For sake of simplification, the lower level and lower interconnect levels of the intermediate level are not illustrated in detail. For illustration purpose, adjacent interconnect levels in the intermediate level 117, such as $M_X$ and $M_{X-1}$, and the upper level 119 are shown in greater detail.

Interconnects are formed in an intermetal dielectric (IMD) layer 120. An IMD layer includes a trench level 140 in an upper portion which corresponds to the metal level (M). For example, interconnects or metal lines 145 are disposed in the trench level of the IMD layer. A lower portion of the IMD layer includes a via level 130 having via contacts 135. A metal level (M) includes a via level (V) below. For example, the metal level $M_X$ includes a via level $V_{X-1}$ below.

The contacts of $V_{X-1}$ couple interconnects of $M_X$ to contact areas below. Depending on the level, the contact areas or regions can be, for example, other interconnects on $M_{X-1}$. For example, in the case where X is ≥2 ($M_2$ or above), the contact areas may be interconnects $145_{X-1}$. In some cases, the contact area may be active device regions, such as diffusion regions of transistors and transistor gates, as well as other types of regions. For example, in the case where X=1 ($M_1$), the contacts are in a premetal dielectric (PMD) level and the contact areas include active device regions. The contact level that couples circuit components' interconnects of the first metal level $M_1$ is referred to as CA, while other contact levels disposed between adjacent metal levels are via levels $V_1$-$V_{X-1}$.

It is understood that the different IMD levels need not be the same. For example, different materials or construction may be employed for different IMD levels. Also, thicknesses as well as design rules, such as line widths may also be different. Generally, the higher the level, the wider the lines. Other configurations of IMD levels are also useful. Also, the lower level (e.g., $M_1$) is formed by a single damascene process while the upper interconnect levels ($M_2$ and above) are formed by a dual damascene process.

The conductive lines, contacts and via contacts are formed of a conductive material. The conductive material may be any metal or alloy. For example, the conductive material may be copper (Cu), aluminum, tungsten (W), their alloys, or a combination thereof. Other types of conductive materials may also be useful. The interconnects and contacts may be formed of the same type of materials. Forming the interconnects and contacts using different types of conductive materials may also be useful. For example, the contacts may be tungsten while the interconnects may be copper. Such a configuration may be useful for premetal and $M_1$ levels. In the case where the contacts and interconnects are formed of the same material, they are preferably formed of copper. Other configurations of interconnects and contacts may also be useful.

The conductive line and/or contact may be provided with vertical or substantially vertical sidewalls. Alternatively, the conductive lines and/or contacts are provided with slanted sidewalls. The slanted sidewall profile can improve sidewall barrier and seed coverage during processing. The slanted sidewalls, for example, include an angle of about 85-89°.

As for the upper level 119, it is disposed over the intermediate interconnect level 117. In one embodiment, the upper level may be referred to as a global interconnect level. It is understood that the upper level may be any interconnect level adjacent to the interconnect level $M_X$. The upper interconnect level includes an upper level dielectric layer. In one embodiment, the upper level dielectric layer is a dielectric stack. For example, a lower and an upper dielectric layer 126 and 128 form the upper level dielectric stack. The upper level dielectric stack includes silicon oxide. In one embodiment, the lower dielectric layer 126 includes TEOS and the upper dielectric layer 128 includes FTEOS. Other configurations and materials for the upper and lower level dielectric layer may also be useful. For example, the upper level dielectric may include other types or number of dielectric layers, including a single dielectric layer.

The upper level, for example, includes via contacts 155 coupling a metal line 165 to contact region or metal or contact pad 170 at the interconnect level of the intermediate level (e.g., $M_X$). In one embodiment, the via contacts 155 may be, for example, fat wire via contacts and the metal line 165 may be, for example, a fat wire metal line. As shown, the intermediate layer has a thickness less than a thickness of the fat wire layers. For example, the height of the via contacts in the intermediate level is less than the height of the fat wire via contacts. The width of the fat wire metal line, for example, may be about 4 to 10 times wider than the width of the conductive line of $M_1$ to $M_X$ and the width of the fat wire via contacts, for example, may be about 4 to 10 times wider than the width of the via contacts in the lower or intermediate level. Other configurations of via contacts 155, metal line 165 and dielectric layers may also be useful.

In one embodiment, the interconnect level of the intermediate level, for example $M_X$, includes a large contact or metal pad 170. The interconnect level of the intermediate level, for example, may be the uppermost interconnect level of the intermediate level. It is understood that $M_X$ may be any interconnect level. The pad, for example, may be larger than 10×10 μm. Providing other sized pads may also be useful depending on the technology design rule. The pad, in one embodiment, accommodates a plurality of fat wire via contacts. For example, the pad accommodates an array of contacts. For example, the contacts may be a 2×3 array of 40 nm contacts. It is understood that the interconnect level of the intermediate level may include a plurality of larger metal pads.

In one embodiment, the metal pad 170 includes an oxidized portion 160. For example, the metal pad includes an oxidized portion, such as copper oxide. The oxidized portion is disposed below, for example, the via opening of the via contact 155 after forming the via opening. The via opening, such as the fat wire via opening, is formed by, for example, a dry etch process. The oxidized portion may include a protrusion that extends about a top surface of the metal pad 170. The protrusion extends above the etch stop layer 138x. The oxidized portion, for example, results from Cu hillock exposure in an oxygen ambient during and after the fat wire via opening formation by the dry etch process or from chemical reaction during the upper metal line trench such as the fat wire trench lithography process. The oxidized portion 160 is in communication with the via contact 155. For example, the oxidized portion is disposed in the metal pad 170 and contacts or is coupled to the fat wire via contact 155. In accordance with one embodiment, the oxidized portion 160 is contained within the metal pad 170.

Since a plurality of via contacts 155 from the upper level connects to the metal pad 170, the oxidized portion 160 does not impact the electrical connection from the upper level metal line 165. For example, the oxidized portion 160 does not create an open connection between the metal pad 170 and the fat wire. Furthermore, by leaving the oxidized portion 160 within the metal pad, an electrical short between the metal pad 170 and interconnect 145 disposed below, such as $M_{X-1}$, is prevented.

FIGS. 2a-2d show an embodiment of a process for forming a device 200. The device formed is similar to that described in FIG. 1. Common elements may not be described or described in detail. As shown, a substrate 105 is provided. The substrate, for example, is a silicon substrate. Other types of substrates, such as silicon germanium or silicon-on-insulator (SOI), are also useful. The substrate may include circuit components (not shown) such as transistors formed thereon. Other types of circuit components are also useful.

The substrate is processed to include interconnect levels 110. The interconnect level includes lower level 115, intermediate level 117 and upper level 119. The lower and intermediate levels include $M_1$ to $M_X$, where 1 is the lowest interconnect level and x corresponds to a number of a metal level. For example, a device may have about 3-6 (e.g., x=3-6) metal levels. Providing other number of metal levels in the lower and intermediate levels may also be useful. The intermediate level, for example, includes a low-k dielectric material, such as SiCOH. Other suitable types of dielectric material may also be useful. Separating the interconnect levels, for example, is an etch stop layer 138. The etch stop layer, for example, is a nitrogen doped SiC layer. Other suitable types of etch stop layers may also be useful.

For the sake of simplification, two adjacent interconnect levels of the intermediate level are shown in detail. For illustration purpose only, the two uppermost interconnect levels of the intermediate level are shown in detail. The two adjacent interconnect levels, for example, correspond to $M_{X-1}$ and $M_X$. Interconnects are formed in an intermetal dielectric (IMD) layer 120. For example, interconnects or metal lines 145 are formed in the trench level 140 of the IMD layer while via contacts 135 are formed in the via level 130. The metal lines and the via contacts may be formed by, for example, plating process. For example, interconnects or metal lines 145 are plated in the trench level 140 of the IMD layer while via contacts 135 are plated simultaneously in the via level 130. Other suitable techniques may also be employed to form the metal lines 145 and the via contacts 135. A lower portion of the IMD layer includes a via level 130 having via contacts 135. A metal level (M) includes a via level (V) below. For example, the metal level $M_X$ includes a via level $V_{X-1}$ below.

In one embodiment, an interconnect level of the intermediate level includes a large contact or metal pad 170. For example, $M_X$ includes a large metal pad. Although one metal pad is shown, a plurality of metal pads may be included in the interconnect level $M_X$ of the intermediate level. In one embodiment, the metal pads, conductive lines and via contacts of the interconnect levels of the intermediate level may be formed of Cu or Cu alloy. Other suitable types of conductive materials may also be useful. The metal pad, conductive lines and via contacts may be formed by dual damascene processes. Other suitable techniques may also be useful.

As for the upper level 119, it is disposed over the interconnect level $M_X$ of the intermediate level 117. In one embodiment, the upper level may be referred to as a global interconnect level. It is understood that the upper level may be any interconnect level adjacent to the interconnect level $M_X$. The upper level includes an upper level dielectric layer. In one embodiment, the upper level dielectric layer is a dielectric stack. For example, a lower and an upper dielectric layer 126 and 128 form the upper level dielectric stack. The upper level dielectric stack includes silicon oxide. In one embodiment, the lower dielectric layer 126 includes TEOS and the upper dielectric layer 128 includes FTEOS. Other suitable types of materials and configurations for the upper level dielectric layer may also be useful. For example, the upper level dielectric layer may include other types or number of dielectric layers, including a single dielectric layer.

The upper level dielectric layer is processed to form via openings $254_{1-2}$. In one embodiment, the via openings $254_{1-2}$ may be fat wire via openings. A plurality of via openings $254_{1-2}$ are formed for a metal pad. For example, an array of via openings $254_{1-2}$ is formed for a metal pad. To form the fat wire via openings, mask and etch techniques can be employed. For example, a soft mask (not shown), such as photoresist, can be used. The photoresist, for example, can be formed by various techniques, such as spin-on. Other techniques are also useful. An anti-reflective coating (ARC) can be formed beneath the soft mask. In one embodiment, a bottom anti-reflective coating (BARC) is provided below the photoresist. The mask layer is selectively exposed and developed to create the desired pattern. In one embodiment, the mask includes a pattern which protects or covers the upper dielectric layer except where via openings $254_{1-2}$ are to be formed. Exposed portions of the upper level dielectric which are not covered by the mask pattern are removed by, for example, a dry etch. Other techniques for patterning the dielectric layer are also useful.

The etch to form the via openings $254_{1-2}$ is relatively selective to the etch stop layer $138_X$. For example, the etch removes the dielectric layer to form the via openings $254_{1-2}$, leaving the etch stop layer $138_X$ remaining. As shown, the metal pad 170 may include hillocks 247, creating an uneven surface with protrusions or bumps. Hillocks may be formed as a result of Cu stress relaxation in the large metal pad. The portion of the etch stop layer $138_X$ over the hillocks may be thinner relative to other portions of the etch stop layer $138_X$. Due to hillocks, the etch to form the via openings $254_{1-2}$ may expose a portion of the underlying metal pad. For example, the etch may unintentionally remove the etch stop layer $138_X$ due to the elevation created by a hillock located at the bottom of the via opening $254_1$.

Figure 2A:
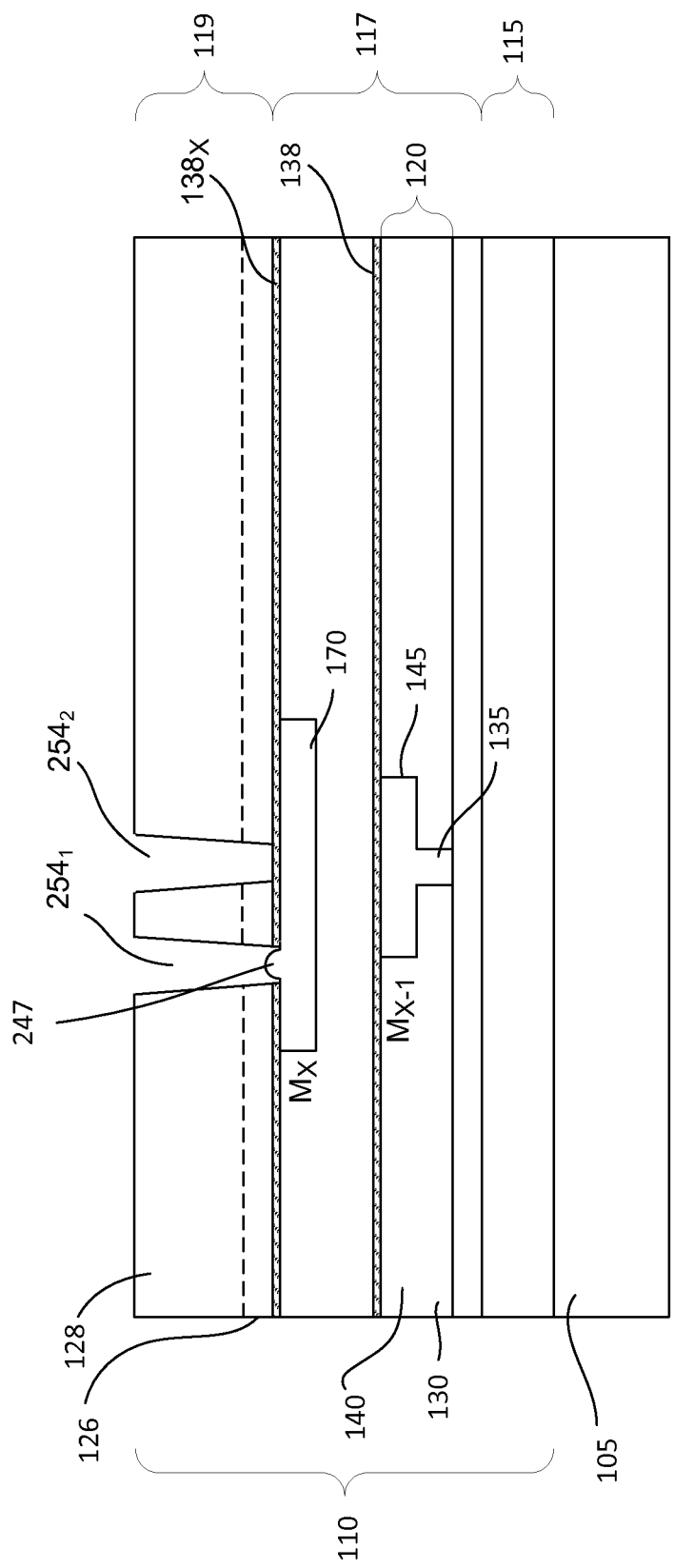
FIGS. 2a-2d show an embodiment of a process of forming a device.
Figure 2B:
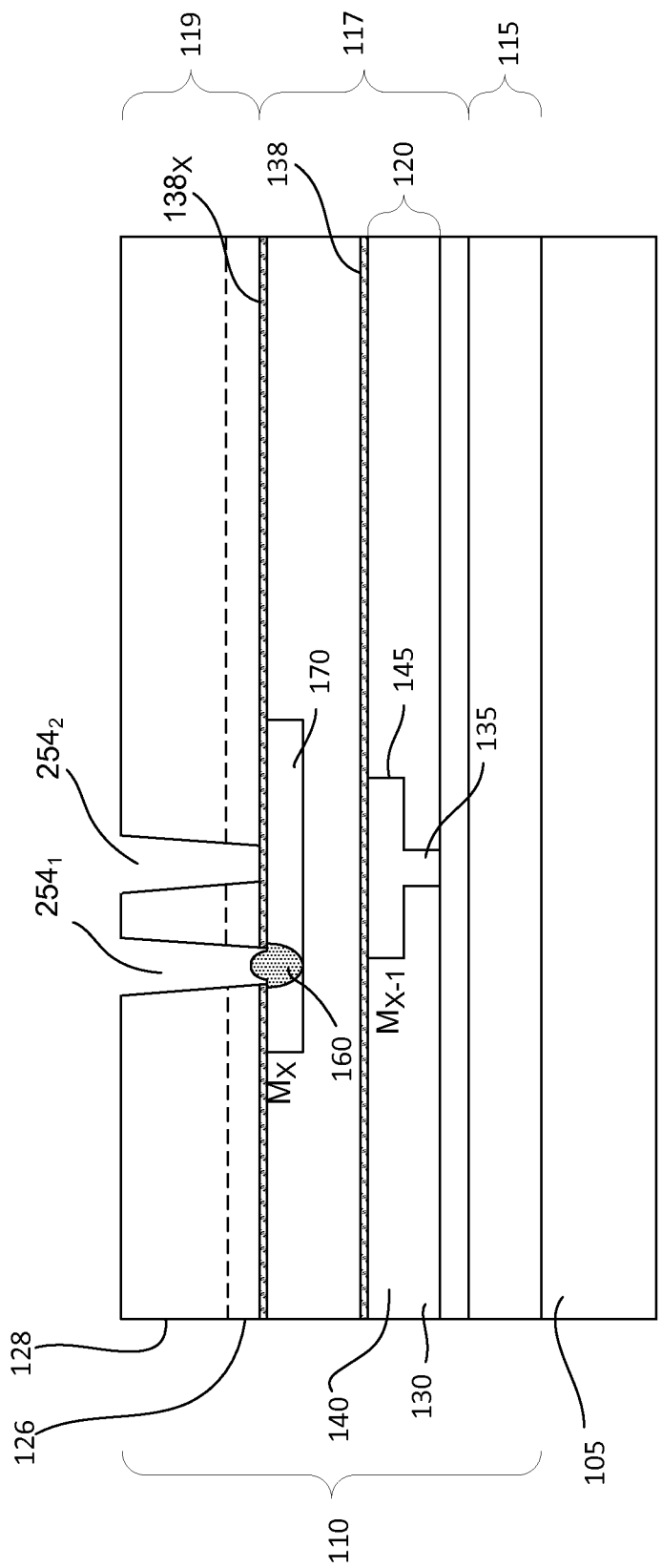

Referring to FIG. 2b, the photoresist and BARC are removed after patterning the via openings $254_{1-2}$. A portion of the metal pad 170 unprotected by the etch stop layer oxidizes, forming an oxidized portion 160. Oxidation occurs when the hillock, such as the Cu hillock protrusion from the metal pad, is exposed to an oxygen ambient during and after the via opening $254_1$ formation by, for example, the dry etch process or exposed to chemical reaction during the upper metal line trench lithography later.

Figure 2C:
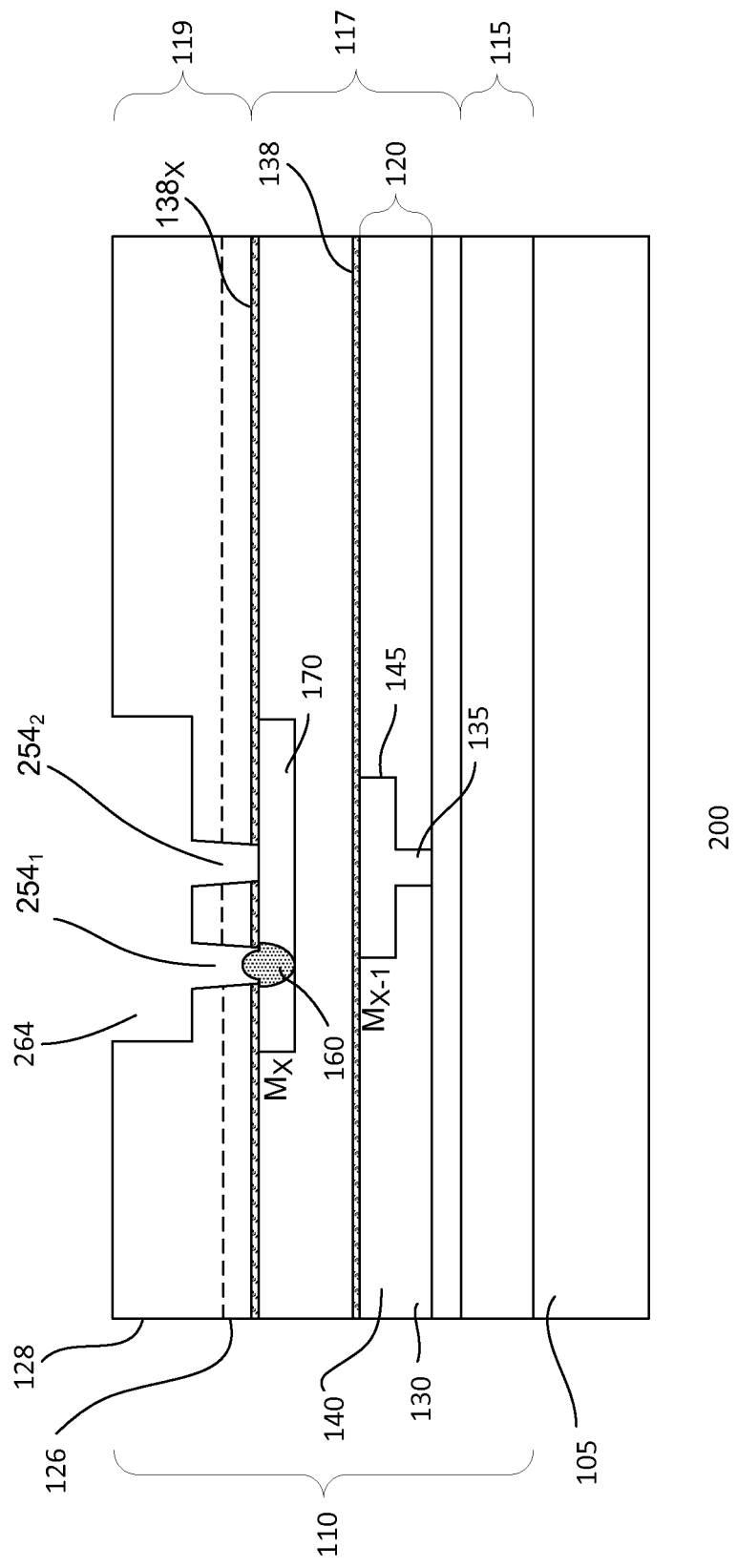

In FIG. 2c, the upper level dielectric is patterned to form a metal line trench 264. In one embodiment, the metal line trench 264 may be a fat wire trench. The trench 264 is in communication with a plurality of the via openings 254 which are in communication with the large metal pad of, for example, $M_X$. The trench may be formed by mask and etch techniques. For example, a soft mask (not shown), such as photoresist, may be used to serve as an etch mask for a dry etch, to pattern the upper level dielectric layer 128 to form the metal line trench. An ARC layer is provided below the photoresist. In one embodiment, the ARC layer is a BARC layer. Other types ARC layers may also be useful.

The etch stop layer $138_X$ in the via opening 2542 is removed during the formation of the metal line trench to expose the metal pad 170. The etch stop layer is removed to expose the large metal pad in, for example, $M_X$.

During the formation of the metal line trench 264, a removal process may be performed. During the removal process, the photoresist is removed. The photoresist may be removed by, for example, solvent clean. In one embodiment, the BARC layer is removed after removing the photoresist. Removal of the BARC layer is achieved by, for example, ashing. Other techniques for removing the resist mask and BARC layer may also be useful. To remove remaining particles or residues of the photoresist and BARC layer, a dry clean process is performed. For example, the remaining particles or residues are removed by a dry clean without removing the oxidized portion 160 of the metal pad 170. The dry clean process, for example, includes an aerosol clean. The aerosol clean, for example, includes gases, such as but not limited to $N_2$. Other suitable types of clean process which leaves the oxidized portion in the metal pad may also be used.

By employing a dry clean process, the oxidized portion 160 of the contact pad 170 is not removed. Leaving the oxidized portion in the metal pad prevents punch through to the interconnect level below. For example, punch through from $M_X$ to $M_{X-1}$ is prevented.

Figure 2D:
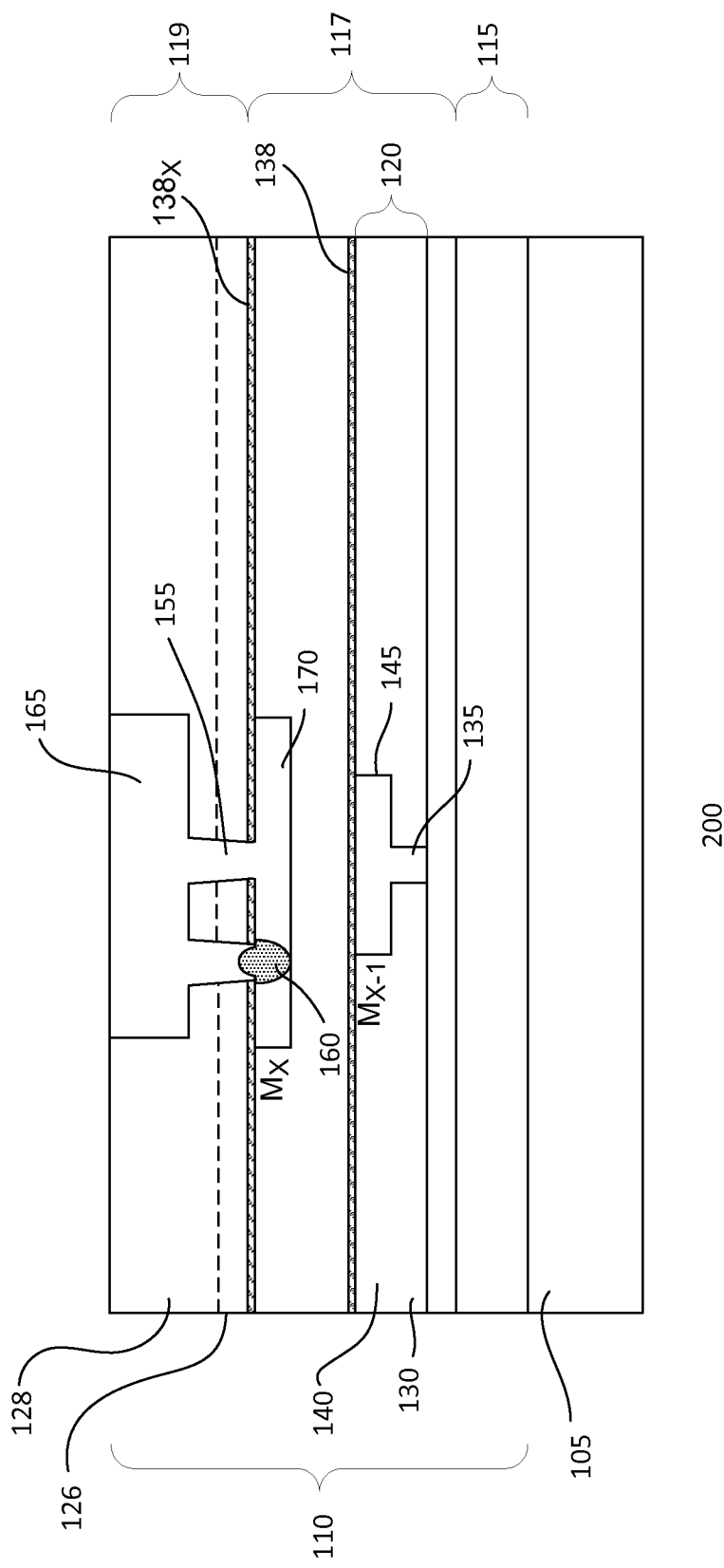

Referring to FIG. 2d, a conductive material is formed on the substrate. The conductive material fills the via openings $254_{1-2}$ and metal line trench 264. The conductive material, in one embodiment, is Cu or Cu alloy. Other types of conductive materials may also be useful. The conductive material may be formed by, for example, plating process. Other deposition techniques may also be useful.

The conductive material fills the via openings, forming via contacts 155 while excess conductive material is removed to form the metal line 165. For example, the via contacts 155 are fat wire via contacts while the metal line 165 is a fat wire. In one embodiment, the excess material is removed by a planarizing process. The planarizing process removes excess conductive material on the surface of the upper level dielectric layer. This results in the top surface of the conductive material being planar with the top surface of the upper level dielectric layer. The planarizing process includes, for example, a polishing process, such as chemical mechanical polishing (CMP). Other types of planarizing or polishing processes are also useful.

The process continues to form the IC. The process, for example, may continue to form bonding pads. For example, Al and Al-alloy deposition and etching may be performed to form Al bonding pads. Further processing can include final passivation, dicing, assembly and packaging. Other processes are also useful.

The removal process as described, for example, in FIG. 2c above, may also be useful for a lithograph rework process. For example, in cases where there is lithography induced misalignment or critical dimension which is out-of-specification, the photoresist and the BARC layers need to be removed before a new or subsequent lithography process can be performed. The photoresist and BARC during a rework process may be removed by the removal process as described above without causing punch through to the underlying interconnect level.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a substrate prepared with intermediate dielectric layer having interconnect levels, wherein the interconnect levels include $M_1$ to $M_X$ metal levels, where 1 is the lowest level and X corresponds to a number of metal level, the metal level $M_X$ includes a metal pad having an oxidized portion which is formed by hillock in the metal pad which is exposed to an oxygen ambient; and
   forming an upper level having an upper dielectric layer over the dielectric layer having $M_X$, wherein the upper dielectric layer is processed to form a plurality of via openings over the metal pad and a metal line trench over the via openings, wherein the metal line trench is formed by
   providing a patterned mask layer having a pattern corresponding to the metal line trench,
   performing an etch to remove portions of the dielectric layer unprotected by the patterned mask,
   performing a removal process to remove the patterned mask layer, wherein the removal process does not remove the oxidized portion of the metal pad, thereby preventing punch through between $M_X$ and its adjacent underlying metal level $M_{X-1}$.

2. The method of claim 1 wherein providing a patterned mask layer comprising:
   providing a photoresist and a bottom anti-reflective coating (BARC) layer over the upper dielectric layer; and
   patterning the photoresist layer to form the patterned mask layer.

3. The method of claim 2 wherein the removal process comprises:
   performing a solvent clean to remove the photoresist;
   performing an ashing process to remove the BARC layer; and
   performing a dry clean to remove remaining particles and residues of the photoresist and BARC layer.

4. The method of claim 1 wherein the oxidized portion includes a protrusion that extends about a top surface of the metal pad.

5. The method of claim 1 wherein:
   the upper level is the global interconnect level, wherein the metal line trench is a fat wire trench and the via openings accommodate fat wire via contacts; and
   the metal level $M_X$ is the uppermost interconnect level of the intermediate dielectric layer.

6. A method for forming a device comprising:
   providing a substrate prepared with intermediate dielectric layer having interconnect levels, wherein the interconnect levels include $M_1$ to $M_X$ metal levels, where 1 is the lowest level and X corresponds to a number of metal level, the metal level $M_X$ is the uppermost interconnect level of the intermediate dielectric layer and includes a metal pad having an oxidized portion; and
   forming an upper level having an upper dielectric layer over the dielectric layer having $M_X$, wherein the upper dielectric layer is processed to form a plurality of via openings which accommodate via contacts over the metal pad and a metal line trench over the via openings, wherein the upper level is the global interconnect level, the metal line trench is a fat wire trench and the via contacts are fat wire via contacts, and wherein the metal line trench is formed by
   providing a patterned mask layer having a pattern corresponding to the metal line trench,
   performing an etch to remove portions of the dielectric layer unprotected by the patterned mask,
   performing a removal process to remove the patterned mask layer, wherein the removal process does not remove the oxidized portion of the metal pad, thereby preventing punch through between $M_X$ and its adjacent underlying metal level $M_{X-1}$.

7. A method for forming a device comprising:
   providing a substrate prepared with intermediate dielectric layer having interconnect levels, wherein the interconnect levels include $M_1$ to $M_X$ metal levels, where 1 is the lowest level and X corresponds to a number of metal level, the metal level $M_X$ includes a metal pad having an oxidized portion, wherein the metal pad comprises Cu or Cu alloy and the oxidized portion is formed by Cu hillock within the metal pad which is exposed to an oxygen ambient during processing; and forming an upper level having an upper dielectric layer over the dielectric layer having $M_X$, wherein the upper dielectric layer comprises a plurality of via contacts over the metal pad and a metal line over the via contacts, wherein the oxidized portion remains within the metal pad and prevents punch through between $M_X$ and its adjacent underlying metal level $M_{X-1}$.

8. The method of claim 7 wherein the plurality of via contacts and the metal line are formed by:

processing the upper dielectric layer to form a plurality of via openings over the metal pad and a metal line trench over the via openings; and filling the via openings and metal line trench with a conductive material to form the via contacts and the metal line.

9. The method of claim 8 wherein the metal line trench is formed by:

providing a patterned mask layer having a pattern corresponding to the metal line trench;

performing an etch to remove portions of the dielectric layer unprotected by the patterned mask; and performing a removal process to remove the patterned mask layer, wherein the removal process does not remove the oxidized portion of the metal pad, thereby preventing punch through between $M_X$ and its adjacent underlying metal level $M_{X-1}$.

10. The method of claim 9 wherein the removal process comprises performing a dry clean to remove remaining particles and residues of the patterned mask layer.

11. The method of claim 10 wherein the dry clean comprises an aerosol clean.

12. The method of claim 11 wherein the aerosol clean comprises gases having $N_2$.

13. The method of claim 7 wherein:

the upper level is the global interconnect level, wherein the metal line is a fat wire and the via contacts are fat wire via contacts; and the metal level $M_X$ is the uppermost interconnect level of the intermediate dielectric layer.

14. The method of claim 7 comprising forming an etch stop layer in between the dielectric layer having $M_X$ and the upper dielectric layer.

15. The method of claim 14 wherein:

the etch stop layer comprises a nitrogen doped SiC layer; and the upper dielectric layer comprises a bottom and a top dielectric stack, wherein the bottom dielectric layer comprises TEOS and the top dielectric layer comprises FTEOS.

16. The method of claim 14 wherein the plurality of via contacts and the metal line are formed by:

processing the upper dielectric layer to form a plurality of via openings over the metal pad and a metal line trench over the via openings; and filling the via openings and metal line trench with a conductive material to form the via contacts and metal line.

17. The method of claim 16 wherein the plurality of via openings over the metal pad are formed by a dry etch process.

18. The method of claim 17 wherein the dry etch process is selective to the etch stop layer.

19. The method of claim 17 wherein the oxidized portion is formed during and after the via openings formation by the dry etch process or exposed to chemical reaction during formation of the metal line trench.

20. The method of claim 14 wherein the oxidized portion includes a protrusion that extends above the etch stop layer.

* * * * *